United States Patent
Shimatou

(10) Patent No.: US 10,607,906 B2
(45) Date of Patent: Mar. 31, 2020

(54) SEMICONDUCTOR PACKAGE, SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Takayuki Shimatou, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/914,990

(22) Filed: Mar. 7, 2018

(65) Prior Publication Data
US 2018/0350705 A1 Dec. 6, 2018

(30) Foreign Application Priority Data
Jun. 5, 2017 (JP) .................. 2017-111214

(51) Int. Cl.
| | |
|---|---|
| *H01L 23/48* | (2006.01) |
| *H01L 23/13* | (2006.01) |
| *H01L 21/768* | (2006.01) |
| *H01L 23/50* | (2006.01) |
| *H01L 23/31* | (2006.01) |
| *H01L 23/498* | (2006.01) |

(52) U.S. Cl.
CPC ............ *H01L 23/13* (2013.01); *H01L 21/768* (2013.01); *H01L 23/3107* (2013.01); *H01L 23/49811* (2013.01); *H01L 23/50* (2013.01); *H01L 23/49838* (2013.01)

(58) Field of Classification Search
CPC ........ H01L 23/13; H01L 23/50; H01L 21/768
USPC .................................. 257/690, 737
See application file for complete search history.

(56) References Cited

U.S. PATENT DOCUMENTS

| | | | | | |
|---|---|---|---|---|---|
| 5,186,383 | A | * | 2/1993 | Melton | B23K 1/0016 228/180.22 |
| 5,220,200 | A | * | 6/1993 | Blanton | H01L 24/81 257/778 |
| 5,269,453 | A | * | 12/1993 | Melton | H01L 23/49866 228/180.22 |
| 5,796,169 | A | * | 8/1998 | Dockerty | H01L 23/49816 257/780 |
| 6,118,182 | A | * | 9/2000 | Barrow | H01L 23/49838 257/734 |

(Continued)

FOREIGN PATENT DOCUMENTS

| | | |
|---|---|---|
| JP | H03-147353 A | 6/1991 |
| JP | H07-249707 A | 9/1995 |
| JP | 2006-210956 A | 8/2006 |

*Primary Examiner* — Nitin Parekh

(57) ABSTRACT

To provide a semiconductor package including a protruding part at the bottom surface of a package main body. A semiconductor package including a semiconductor chip is provided, the semiconductor package including: a package main body; a plurality of electrodes exposed at a bottom surface of the package main body; and a protruding part projecting from the bottom surface of the package main body and above the plurality of electrodes, wherein the protruding part is arranged not to overlap two least separated electrodes, among the plurality of electrodes, in a second direction different from a first direction in which the two electrodes are arrayed.

16 Claims, 9 Drawing Sheets

(56) References Cited

U.S. PATENT DOCUMENTS

| | | | | |
|---|---|---|---|---|
| 6,188,127 B1* | 2/2001 | Senba | .................... | H01L 21/563 |
| | | | | 257/685 |
| 6,563,712 B2* | 5/2003 | Akram | ................ | H01L 23/3121 |
| | | | | 165/185 |
| 2001/0038144 A1* | 11/2001 | Grigg | ...................... | H01L 23/24 |
| | | | | 257/698 |
| 2002/0043711 A1* | 4/2002 | Akram | .................... | H01L 23/16 |
| | | | | 257/690 |
| 2006/0108678 A1* | 5/2006 | Kumar | ............... | B23K 35/0222 |
| | | | | 257/690 |
| 2009/0039495 A1* | 2/2009 | Yamashita | ........ | H01L 23/49838 |
| | | | | 257/690 |

\* cited by examiner

SEMICONDUCTOR PACKAGE, SEMICONDUCTOR DEVICE AND SEMICONDUCTOR DEVICE MANUFACTURING METHOD

The contents of the following Japanese patent application(s) are incorporated herein by reference:

NO. 2017-111214 filed in JP on Jun. 5, 2017.

BACKGROUND

1. Technical Field

The present invention relates to a semiconductor package, a semiconductor device and a semiconductor device manufacturing method.

2. Related Art

Conventionally, a semiconductor device provided with a protruding part at its semiconductor package having a semiconductor chip has been known (please see Patent Documents 1 to 3, for example).

Patent Document 1: Japanese Patent Application Publication No. H7-249707

Patent Document 2: Japanese Patent Application Publication No. 2006-210956

Patent Document 3: Japanese Patent Application Publication No. H3-147353

However, when surface-mounting semiconductor packages on substrates of conventional semiconductor devices by flow steps, solder does not enter well between the semiconductor packages and the mount boards, and soldering failure occurs, in some cases.

SUMMARY

A first aspect of the present invention provides a semiconductor package including a semiconductor chip, the semiconductor package including: a package main body; a plurality of electrodes exposed at a bottom surface of the package main body; and a protruding part projecting from the bottom surface of the package main body and above the plurality of electrodes. The protruding part may be arranged not to overlap two least separated electrodes, among the plurality of electrodes, in a second direction different from a first direction in which the two electrodes are arrayed.

The semiconductor package may include a plurality of protruding parts. The plurality of protruding parts may be arranged not to overlap the two electrodes in the second direction.

The plurality of electrodes may have: a first electrode overlapping the protruding part in the second direction; and a second electrode that has a smaller area of exposure than that of the first electrode and does not overlap the protruding part in the second direction.

The protruding part may have: a first protruding part arranged at a corner of the bottom surface of the package main body; and a second protruding part arranged between the first electrode and the second electrode.

The semiconductor package may include a plurality of the second electrodes arrayed in the first direction. Width of the second protruding part in the first direction may be the same as an interval between the plurality of the second electrodes in the first direction.

Width of the second protruding part in the first direction may be larger than width of the first protruding part in the first direction.

Width of the second protruding part in the second direction may be larger than width of the second protruding part in the first direction.

Distance L1 between the first electrode and the second protruding part in the second direction may be smaller than distance L2 between the second electrode and the second protruding part in the second direction.

Distance L1 between the first electrode and the second protruding part in the second direction may be larger than distance L2 between the second electrode and the second protruding part in the second direction.

An edge of the protruding part may be rounded.

A planar shape of the protruding part may be rounded.

A second aspect of the present invention provides a semiconductor device including: a mount board to which the semiconductor package is attached; and solder provided between the mount board and the semiconductor package.

A third aspect of the present invention provides a semiconductor device manufacturing method including: preparing a semiconductor package having: a package main body; a plurality of electrodes exposed at a bottom surface of the package main body; and a protruding part projecting above the plurality of electrodes, the protruding part being arranged not to overlap two least separated electrodes, among the plurality of electrodes, in a second direction different from a first direction in which the two electrodes are arrayed; tentatively fastening the semiconductor package and a mount board together; and causing solder to flow through between the semiconductor package and the mount board.

In the causing the solder to flow, the semiconductor package may move in the second direction.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

FIRST EXAMPLE

Figure 1:
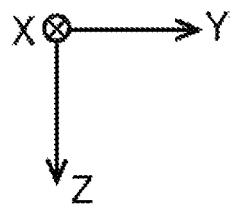
FIG. 1 is a figure for explaining a semiconductor device 100 according to a first example.
Figure 1:
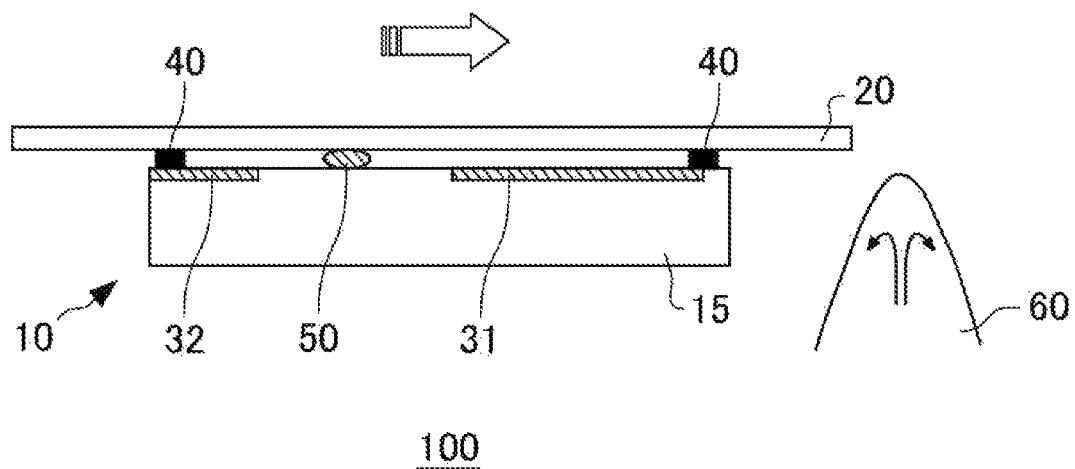

FIG. 1 is a figure for explaining a semiconductor device 100 according to a first example. The semiconductor device 100 includes a semiconductor package 10 and a mount board 20. FIG. 1 shows a flow step for soldering the semiconductor package 10 and the mount board 20 together.

The semiconductor package 10 includes a semiconductor chip such as a MOSFET or an IGBT, and is formed into a package with resin or the like. In one example, the semiconductor package 10 is a non-lead type surface-mount package. The semiconductor package 10 includes a package main body 15, a first electrode 31, a second electrode 32 and protruding parts 40. The semiconductor package 10 may include a plurality of the first electrodes 31 and a plurality of the second electrodes 32. Also, the package main body 15 has the protruding parts 40 at its bottom surface. The bottom surface of the package main body 15 refers to a surface on the side where the package main body 15 is mounted on the mount board 20. In the present specification, the negative side in Z-axis direction is treated as the bottom surface side of the package main body 15.

The mount board 20 is a substrate on which the semiconductor package 10 is mounted. After the semiconductor package 10 is tentatively fastened to the mount board 20 with a glue 50, the semiconductor package 10 is attached to the mount board 20 with solder 60. For example, the first electrode 31 and the second electrode 32 are tentatively fastened to face predetermined positions of the mount board 20, and are connected to the mount board 20 with the solder 60.

The first electrode 31 is provided being exposed to the bottom surface of the package main body 15. The first electrode 31 may project from the bottom surface of the semiconductor package 10. The first electrode 31 is formed at an end portion, of the semiconductor package 10, on the positive side in Y-axis direction. One first electrode 31 of the present example is provided to the semiconductor package 10. For example, the first electrode 31 is a drain electrode.

The second electrode 32 is provided being exposed to the bottom surface of the package main body 15. The second electrode 32 may project from the bottom surface of the semiconductor package 10. The second electrode 32 is formed at an end portion, of the semiconductor package 10, on the negative side in Y-axis direction. A plurality of the second electrodes 32 of the present example are provided to the semiconductor package 10. For example, the second electrodes 32 are gate electrodes and source electrodes.

The protruding parts 40 are provided to the bottom surface of the package main body 15. The protruding parts 40 are provided projecting from the bottom surface of the package main body 15 and above the first electrode 31 and the second electrode 32. The protruding parts 40 ensure a gap between the semiconductor package 10 and the mount board 20. Thereby, it becomes easier for the solder 60 to flow through between the semiconductor package 10 and the mount board 20. The semiconductor package 10 preferably has a plurality of the protruding parts 40. The plurality of protruding parts 40 are arranged such that a uniform gap is ensured between the semiconductor package 10 and the mount board 20. The protruding parts 40 may be formed of a material which is the same as the resin of the semiconductor package 10.

At the flow step, the solder 60, in its melted state, flows through between the semiconductor package 10 and the mount board 20. For example, by the semiconductor device 100 moving toward the direction of a jet of the solder 60, the solder 60 flows through between the semiconductor package 10 and the mount board 20. The semiconductor device 100 of the present example moves in Y-axis direction. That is, the flow direction of the semiconductor device 100 becomes Y-axis direction. The solder 60 may be provided between the semiconductor package 10 and the mount board 20 and at a thickness which is the same as the thickness of the protruding parts 40. The solder 60 selectively wet-spreads to the first electrode 31 and the second electrode 32 due to the flow step. Thereby, the first electrode 31 and the second electrode 32 are connected to a circuit provided to the mount board 20. The semiconductor device 100 may move, in Y-axis direction, from the positive side over to the negative side, or may move, in Y-axis direction, from the negative side over to the positive side.

Figure 2:
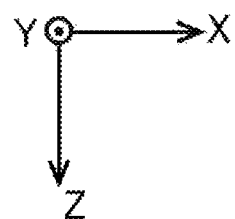
FIG. 2 is one example of a cross-sectional view of the semiconductor device 100 according to the first example.
Figure 2:
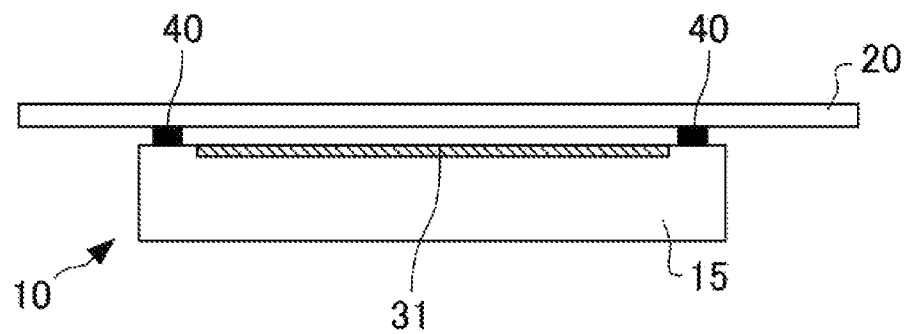

FIG. 2 is one example of a cross-sectional view of the semiconductor device 100 according to the first example. The figure is different from FIG. 1 in that it shows a view as seen from the positive side in Y-axis direction. That is, the figure is a cross-sectional view as viewed from the flow direction of the semiconductor device 100. The first electrode 31 is provided to the center of the semiconductor package 10.

The protruding parts 40 are provided not to overlap the first electrode 31 in the flow direction. Being not overlapping in the flow direction refers to a situation where respective members are provided at different positions in X-axis direction. If the first electrode 31 and the protruding parts 40 overlap in the flow direction, the solder 60 does not flow well through between the semiconductor package 10 and the mount board 20 in some cases.

Also, the protruding parts 40 are preferably arranged so as not to overlap the second electrode 32 as well, in the flow direction. Thereby, it becomes easier for the solder 60 to flow through between the semiconductor package 10 and the mount board 20, without being hindered by the protruding parts 40.

As mentioned above, the semiconductor device 100 ensures a gap between the semiconductor package 10 and the mount board 20 by the protruding parts 40 being provided between the semiconductor package 10 and the mount board 20. Also, if the protruding parts 40 do not overlap the first electrode 31 and the second electrode 32 in the flow direction, it becomes still easier for the solder 60 to wet-spread to the first electrode 31 and the second electrode 32. In this manner, the semiconductor device 100 can reduce the soldering failure ratio, and suppress the cost. Also, the cost lowers because of the reduced number of positions of fixation of the glue 50.

SECOND EXAMPLE

Figure 3:
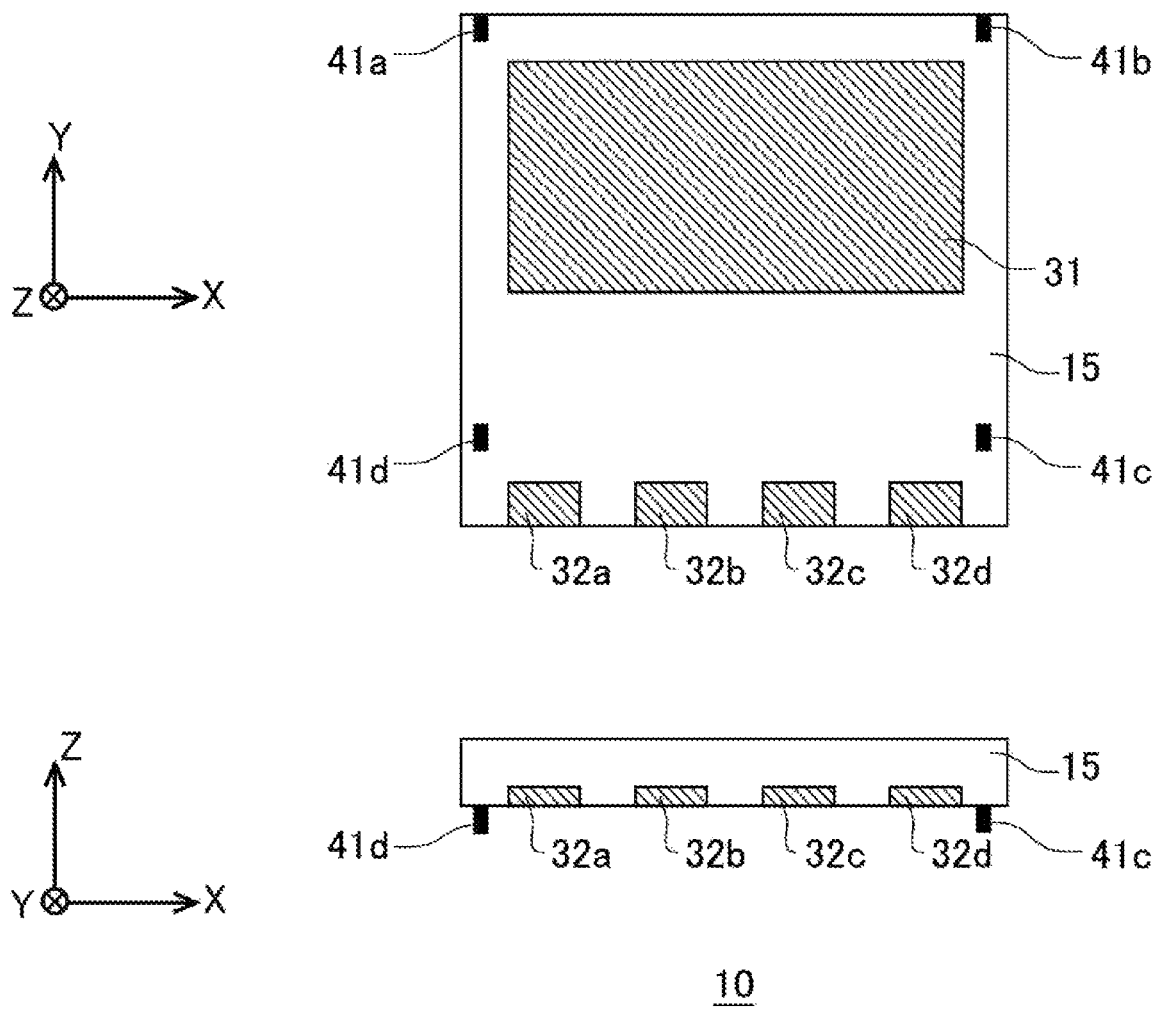
FIG. 3 shows one example of the configuration of the semiconductor package 10 according to a second example.

FIG. 3 shows one example of the configuration of the semiconductor package 10 according to a second example. The semiconductor package 10 of the present example includes the first electrode 31, the second electrodes 32 and first protruding parts 41.

The first electrode 31 is provided on the positive side, of the semiconductor package 10, in Y-axis direction. The first electrode 31 is exposed at the bottom surface of the package main body 15. The area of exposure of the first electrode 31 is larger than the area of exposure of each among a second electrode 32a to a second electrode 32d. The first electrode 31 of the present example has a rectangular planar shape, but this is not the sole example.

The second electrodes 32 are provided on the negative side, of the semiconductor package 10, in Y-axis direction relative to the first electrode 31. The second electrodes 32 of the present example include four second electrodes 32a to 32d. The four second electrodes 32a to 32d are arrayed in X-axis direction at an end portion of the semiconductor package 10. Although the second electrodes 32a to 32d of the present example are arrayed at constant intervals, they may be arrayed at mutually different intervals. The intervals between electrodes are arranged such that the intervals between the second electrodes 32 become the smallest. That is, the interval between second electrodes 32 is smaller than the interval between a first electrode 31 and a second electrode 32. The second electrodes 32 of the present example have a rectangular planar shape, but this is not the sole example.

The first protruding parts 41 have four first protruding parts 41a to 41d. The first protruding parts 41 are one example of the protruding parts 40. The first protruding parts 41a to 41d are arranged in a square shape at the bottom surface of the package main body 15. Each among first protruding parts 41a to 41d of the present example is provided not to overlap the first electrode 31 and the second electrodes 32a to 32d in the flow direction. The first protruding parts 41a to 41d of the present example have longitudinal sides in the flow direction. Thereby, influence of the first protruding parts 41a to 41d on a flow of the solder 60 is not significant. However, the first protruding parts 41a to 41d may have longitudinal sides in X-axis direction as long as they do not overlap the first electrode 31 and the second electrodes 32a to 32d.

Here, for the first protruding parts 41, the direction in which two least separated electrodes among a plurality of electrodes, which are the first electrode 31 and the second electrodes 32a to 32d, are arrayed is treated as a first direction (that is, X-axis direction). A second direction (that is, Y-axis direction) different from the first direction is treated as a flow direction. In this manner, the direction different from the direction in which the two least separated electrodes are arrayed is preferably treated as the flow direction. The protruding parts 40 are preferably arranged not to overlap at least those two electrodes. The plurality of first protruding parts 41 are preferably arranged so as not to overlap those two electrodes, in the flow direction. In the present example, the first direction and the second direction are orthogonal to each other, but this is not the sole example.

THIRD EXAMPLE

Figure 4:
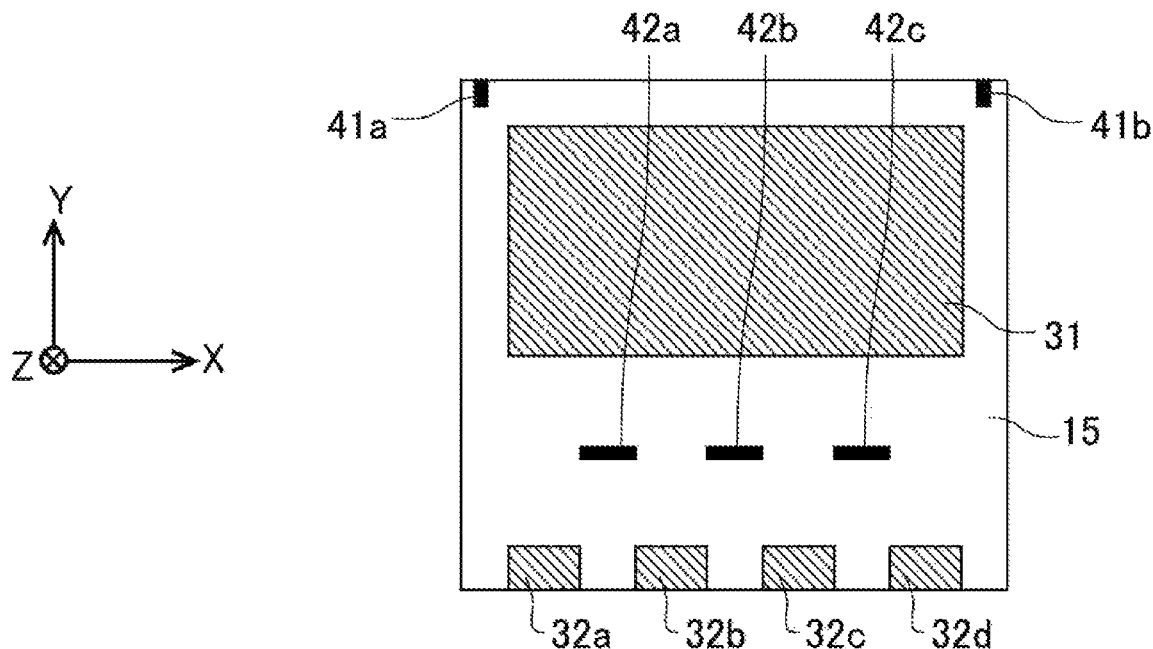
FIG. 4 shows one example of the configuration of the semiconductor package 10 according to a third example.
Figure 4:
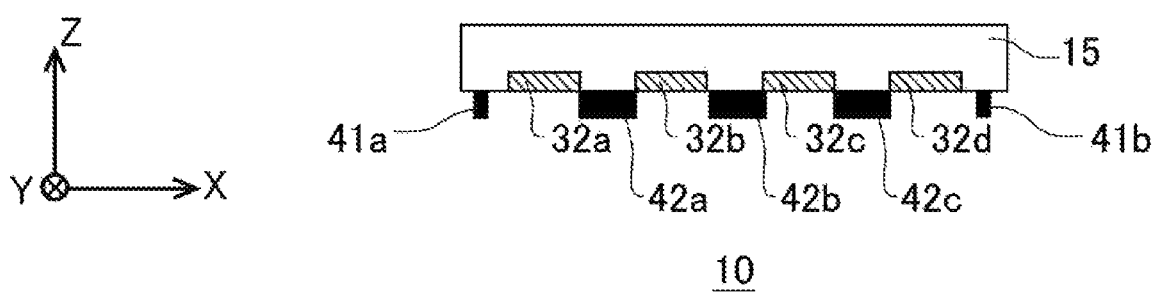

FIG. 4 shows one example of the configuration of the semiconductor package 10 according to a third example. The semiconductor package 10 of the present example includes the first electrode 31, the second electrodes 32, the first protruding parts 41 and the second protruding parts 42. The semiconductor package 10 of the present example is different from the semiconductor package 10 according to the second example in terms of the number of the first protruding parts 41. Also, the semiconductor package 10 of the present example is different from the semiconductor package 10 according to the second example in that it includes the second protruding parts 42. In the present example, differences from the semiconductor package 10 according to the second example are explained particularly.

The first electrode 31 may overlap the protruding parts in the flow direction. The first electrode 31 of the present example overlaps second protruding parts 42a to 42c in the flow direction. However, at least part of the first electrode 31 preferably does not overlap any of the protruding parts in the flow direction. Thereby, it becomes easier for the solder 60 to spread around to the first electrode 31.

The second electrodes 32 include four second electrodes 32a to 32d. The second electrodes 32a to 32d have the area of exposure smaller than that of the first electrode 31. The second electrodes 32a to 32d of the present example do not overlap any of the protruding parts in the flow direction. That is, the second electrodes 32a to 32d do not overlap the first protruding parts 41a, 41b and the second protruding parts 42a to 42c.

The first protruding parts 41 are one example of protruding parts which do not overlap the first electrode 31 and the second electrodes 32 in the flow direction. The first protruding parts 41 include two protruding parts, the first protruding part 41a and the first protruding part 41b. The first protruding parts 41a, 41b are arranged at corners of the semiconductor package 10. The first protruding parts 41a, 41b of the present example are provided to end portions, of the semiconductor package 10, on the positive side in Y-axis direction. By the first protruding parts 41 being provided to corners of the semiconductor package 10, it becomes easier to ensure a gap between the semiconductor package 10 and the mount board 20.

The second protruding parts 42 are one example of protruding parts which overlap the first electrode 31 in the flow direction, but do not overlap the second electrodes 32 in the flow direction. The second protruding parts 42 include the three second protruding parts 42a to 42c. The second protruding parts 42 are one example of the protruding parts 40. The second protruding parts 42a to 42c are arranged between the first electrode 31 and the second electrodes 32a to 32d in the flow direction. The second protruding parts 42a to 42c of the present example have the same width in X-axis direction. For example, the width of the second protruding parts 42a to 42c in X-axis direction may be the same as the intervals between the second electrodes 32a to 32d in X-axis direction. Thereby, the second protruding parts 42a to 42c can ensure a uniform gap between the semiconductor package 10 and the mount board 20 while ensuring spreading of the solder 60 around to the second electrodes 32. Also, the second protruding parts 42a to 42c overlap space between two electrodes that are least separated in the flow direction (the second electrodes 32a to 32d). Thereby, unintended formation of a conduction path due to penetration of the solder 60 into space between the two least separated electrodes 32 can be prevented.

FOURTH EXAMPLE

Figure 5:
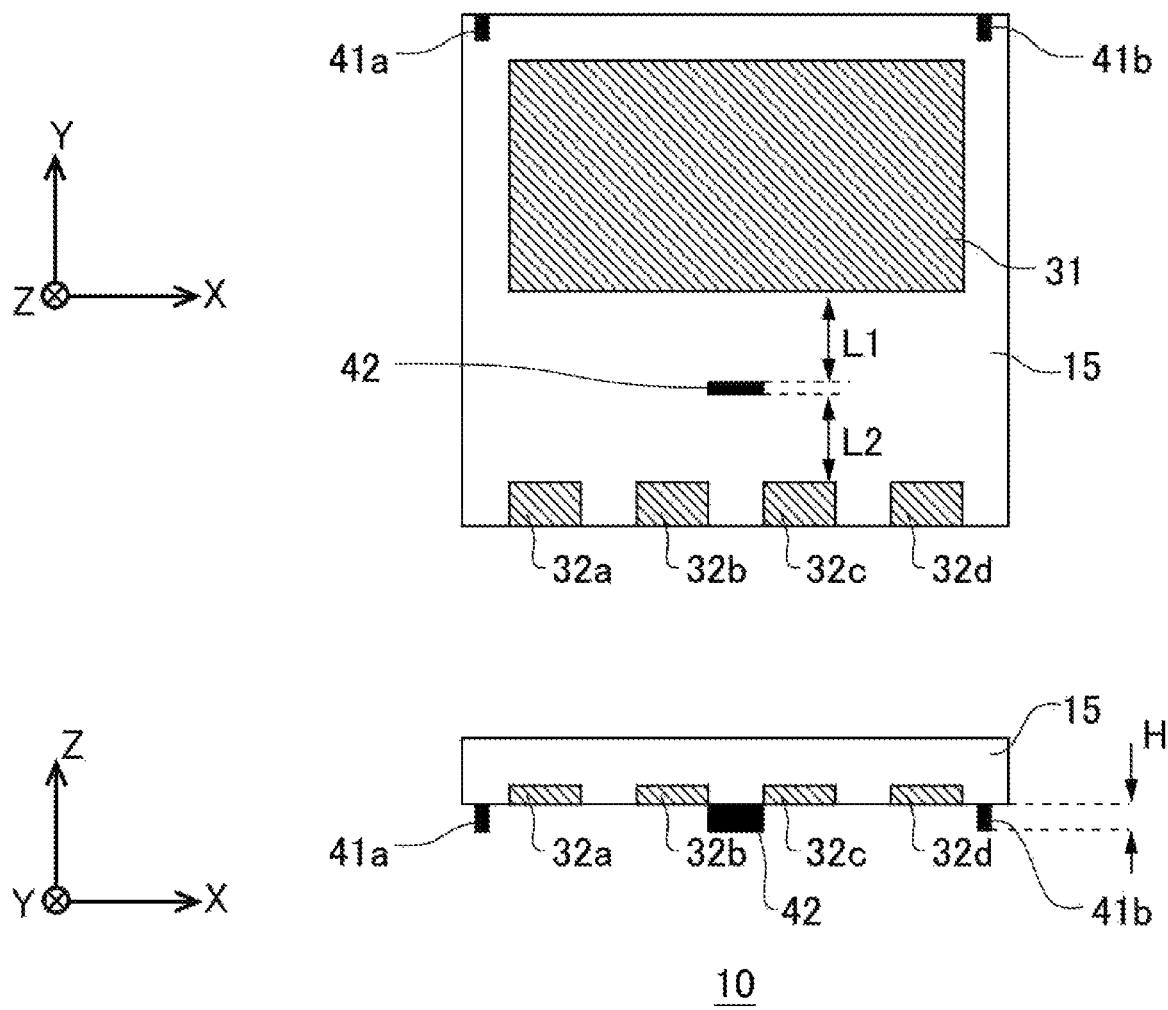
FIG. 5 shows one example of the configuration of the semiconductor package 10 according to a fourth example.

FIG. 5 shows one example of the configuration of the semiconductor package 10 according to a fourth example. The semiconductor package 10 of the present example includes the first electrode 31, four second electrodes 32a to 32d, two first protruding parts 41a, 41b and one second protruding part 42. The semiconductor package 10 of the present example is different from the semiconductor package 10 according to the third example in that it includes the one second protruding part 42. In the present example, differences from the semiconductor package 10 according to the third example are explained particularly.

The one second protruding part 42 is provided between the first electrode 31 and the second electrodes 32. The second protruding part 42 of the present example is arranged not to overlap the second electrodes 32 in the flow direction. The second protruding part 42 has a longitudinal side in X-axis direction. On the other hand, the first protruding parts 41 have a longitudinal side in Y-axis direction. For example, width of the second protruding part 42 in X-axis direction is larger than width of the first protruding parts 41 in X-axis direction. In this manner, even if the second protruding part 42 has a longitudinal side in X-axis direction, influence on spreading around of the solder 60 is not significant because it does not overlap the second electrodes 32 in the flow direction.

Distance L1 is distance between the second electrode 32 and the second protruding part 42 in Y-axis direction. Distance L2 is distance between the first electrode 31 and the second protruding part 42 in Y-axis direction. The distance L1 may be smaller than the distance L2. With the distance L1 being smaller than the distance L2, spreading around of the solder 60 toward the second electrode 32 side can be improved. Also, unintended formation of a conduction path due to penetration of the solder 60 into space between the two least separated electrodes 32 can be prevented.

Also, the distance L1 may be larger than the distance L2. With the distance L1 being larger than the distance L2, spreading around of the solder 60 toward the first electrode 31 side can be improved. Also, because if the distance L1 is larger than the distance L2, the distances between the first protruding parts 41a, 41b and the second protruding part 42 increase, support of the semiconductor package 10 by the protruding parts is stabilized.

The relationship between the distance L1 and the distance L2 may be adjusted as appropriate considering spreading of the solder 60 around toward the distance L1 side, L2 side, and stability of support of the semiconductor package 10. For example, the distance L1 may be the same as the distance L2.

Height H of the first protruding parts 41 refers to length from the bottom surfaces of the second electrodes 32 to the edges of the first protruding parts 41. The first protruding parts 41 project above at least the bottom surfaces of the second electrodes 32 and toward the negative side in Z-axis direction. The first protruding parts 41 have the height H the magnitude of which allows the solder 60 to spread around to space between the semiconductor package 10 and the mount board 20. For example, the height H of the first protruding parts 41 may be 5 μm or larger, and preferably is 10 μm or larger. However, if the height H of the first protruding parts 41 is excessively large, the required amount of the solder 60 increases.

FIFTH EXAMPLE

Figure 6:
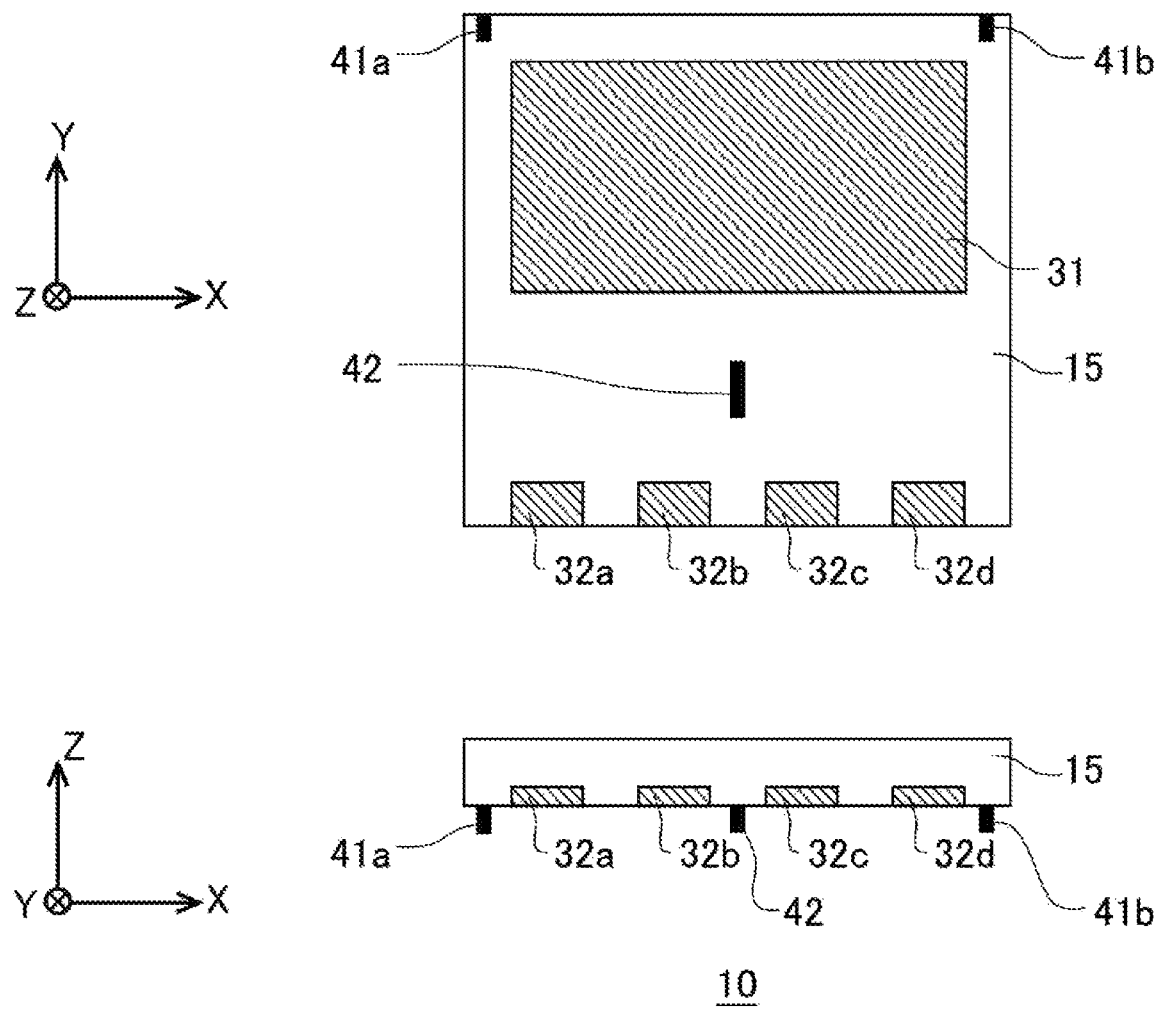
FIG. 6 shows one example of the configuration of the semiconductor package 10 according to a fifth example.

FIG. 6 shows one example of the configuration of the semiconductor package 10 according to a fifth example. The semiconductor package 10 of the present example includes the first electrode 31, four second electrodes 32a to 32d, two first protruding parts 41a, 41b, and the second protruding part 42. The semiconductor package 10 of the present example is different from the semiconductor package 10 according to the fourth example in terms of the arrangement of the second protruding part 42. In the present example, differences from the fourth example are explained particularly.

The second protruding part 42 has a longitudinal side in the flow direction. That is, width of the second protruding part 42 in Y-axis direction is larger than width of the second protruding part 42 in X-axis direction. Because the second protruding part 42 of the present example has a longitudinal side in the flow direction, the area of support between the semiconductor package 10 and the mount board 20 increases without hindering a flow of the solder 60. Thereby, the semiconductor device 100 can ensure a gap between the semiconductor package 10 and the mount board 20.

SIXTH EXAMPLE

Figure 7:
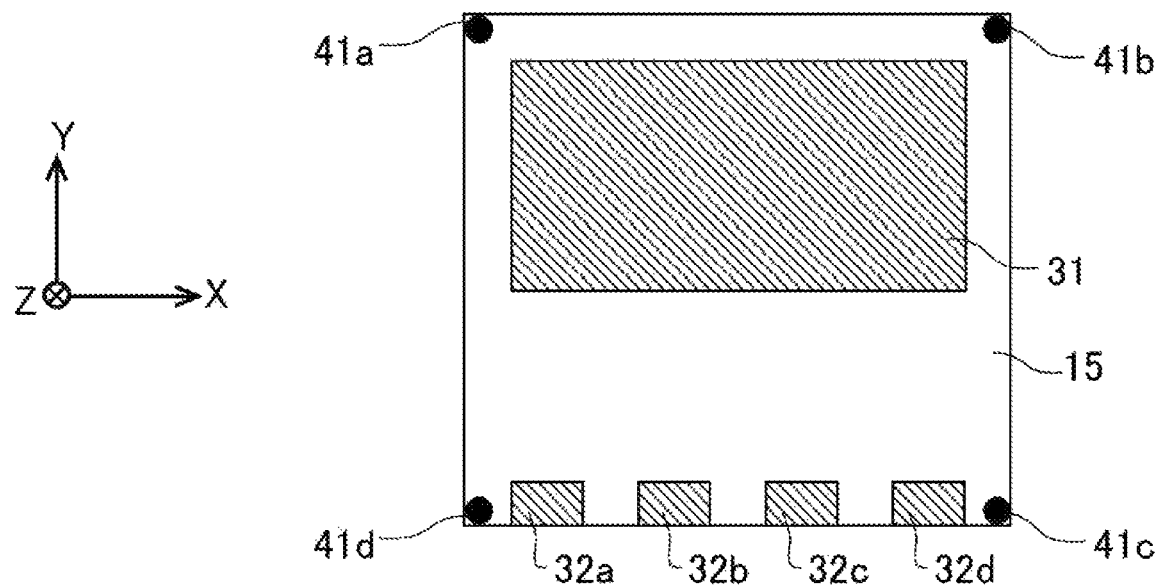
FIG. 7 shows one example of the configuration of the semiconductor package 10 according to a sixth example.
Figure 7:
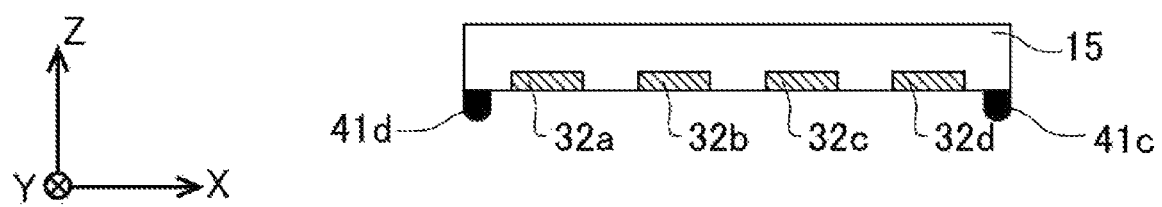

FIG. 7 shows one example of the configuration of the semiconductor package 10 according to a sixth example. The semiconductor package 10 of the present example includes the first electrode 31, four second electrodes 32a to 32d and four first protruding parts 41a to 41d. The semiconductor package 10 of the present example is different from the semiconductor package 10 according to the second example in terms of the arrangement and shape of the second protruding parts 42. In the present example, differences from the semiconductor package 10 according to the second example are explained particularly.

The first protruding parts 41a to 41d are provided to four corners on the bottom surface of the package main body 15. The first protruding parts 41a to 41d of the present example are provided outside the first electrode 31. The first protruding parts 41a to 41d of the present example have rounded edges. Thereby, even if the first protruding parts 41 contact the mount board 20 or the like, it becomes difficult for the edges of the first protruding parts 41 to be chipped off. Also, the first protruding parts 41a to 41d of the present example have rounded planar shapes. Although the first protruding parts 41a to 41d of the present example have circular planar shapes, they may have any structure as long as part thereof is rounded. They may have a structure having a chamfered edge or planar shape. Thereby, spreading of the solder 60 around the first protruding parts 41 improves.

Although as mentioned above, one example of the configuration of the semiconductor package 10 in a plurality of examples has been shown, respective configurations may be used in combination with another example. For example, the configuration of the first protruding parts 41 in the sixth example in which an edge or planar shape thereof is rounded may be applied to the protruding parts 40 according to another example.

Figure 8:
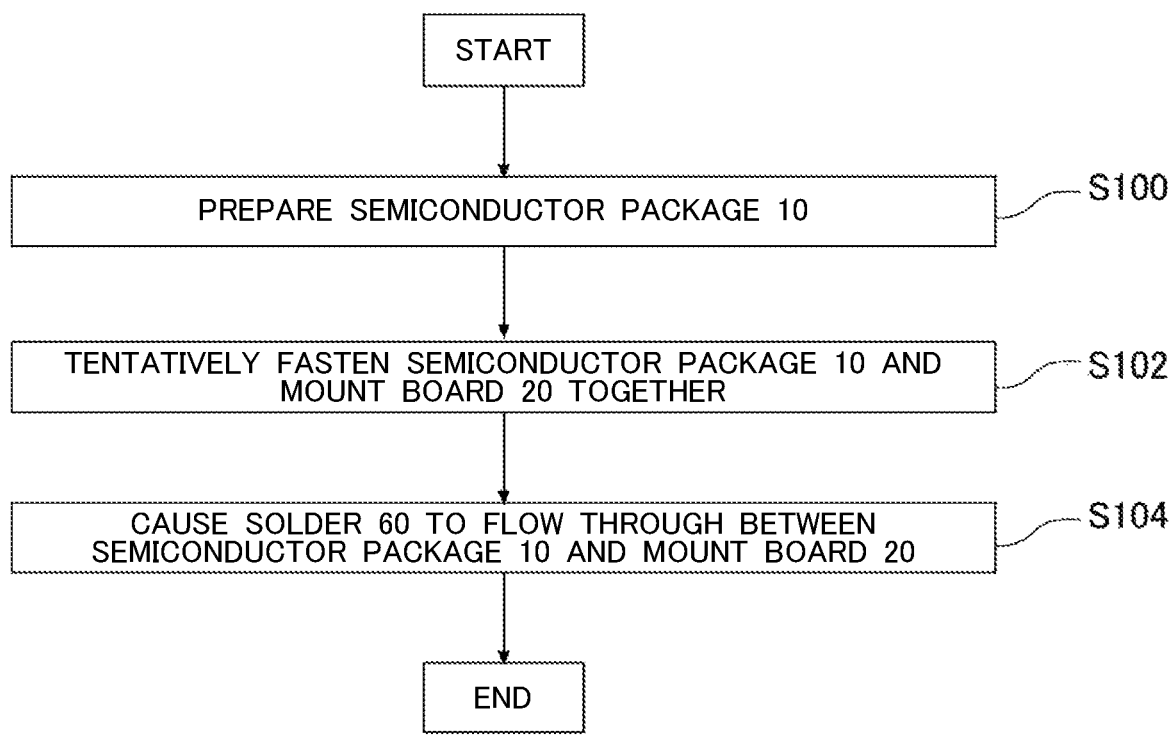
FIG. 8 is a flowchart showing one example of a method of manufacturing the semiconductor device 100.

FIG. 8 is a flowchart showing one example of a method of manufacturing a semiconductor device 100. The semiconductor device 100 of the present example is formed using Step S100 to Step S104.

At Step S100, the semiconductor package 10 is prepared. The semiconductor package 10 includes: the first electrode 31 and the second electrode 32; and the protruding parts 40 that are arranged not to overlap two least separated electrodes, among the plurality of electrodes, in a second direction different from a first direction in which the two electrodes are arrayed, and projects above the plurality of electrodes.

At Step S102, the semiconductor package 10 and the mount board 20 are tentatively fastened together. For example, the semiconductor package 10 and the mount board 20 are tentatively fastened together with the glue 50. The semiconductor package 10 and the mount board 20 are fixed to a degree that does not allow shifting of the position of the semiconductor package 10 relative to the mount board 20 upon contact with a jet of the solder 60. Although the positions and number of the positions at which the glue 50 is provided can be any positions and number, it is provided not to suppress flowing through of the solder 60. In one example, the glue 50 is preferably provided to a position far away from the protruding parts 40.

At Step S104, the melted solder 60 is cause to flow through between the semiconductor package 10 and the mount board 20. At the step of causing the solder 60 to flow, the semiconductor package 10 and the mount board 20 move in the flow direction. The solder 60 is caused flow through between the semiconductor package 10 and the mount board 20. Thereby, it becomes easier for the solder 60 to be supplied to a plurality of electrodes.

Figure 9:
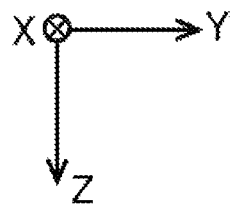
FIG. 9 is a figure for explaining a semiconductor device 500 according to a first comparative example.
Figure 9:
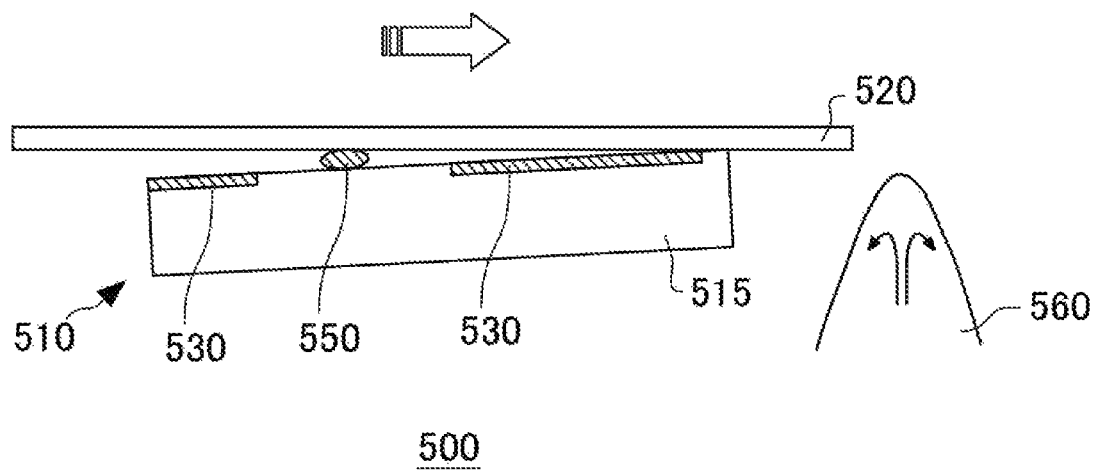

FIG. 9 is a figure for explaining a semiconductor device 500 according to a first comparative example. The semiconductor device 500 includes a semiconductor package 510 and a mount board 520. The semiconductor package 510 has a package main body 515 and an electrode 530. The semiconductor package 510 and the mount board 520 are tentatively fastened together with a glue 550.

Because the semiconductor package 510 does not have a protruding part, the semiconductor package 510 and the mount board 520 may be tentatively fastened together, inclining to each other. In this case, a gap between the semiconductor package 510 and the mount board 520 becomes non-uniform. Therefore, it becomes difficult for the solder 560 to flow through between the semiconductor package 510 and the mount board 520, and the solder 560 does not flow well to the electrode 530, possibly causing a mount failure.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor package; 15: package main body; 20: mount board; 31: first electrode; 32: second electrode; 40: protruding part; 41: first protruding part; 42: second protruding part; 50: glue; 60: solder; 100: semiconductor device; 500: semiconductor device; 510: semiconductor package; 515: package main body; 520: mount board; 530: electrode; 550: glue; 560: solder

What is claimed is:

1. A semiconductor package including a semiconductor chip, the semiconductor package comprising:
a package main body;
a plurality of electrodes exposed at a bottom surface of the package main body; and
a protruding part projecting from the bottom surface of the package main body and above the plurality of electrodes, wherein
the protruding part is arranged not to overlap two least separated electrodes, among the plurality of electrodes, in a second direction different from a first direction in which the two electrodes are arrayed, and
the plurality of electrodes have:
a first electrode overlapping the protruding part in the second direction; and
a second electrode that has a smaller area of exposure as seen in a plan view than that of the first electrode and does not overlap the protruding part in the second direction.

2. The semiconductor package according to claim 1, wherein
the protruding part has:
a first protruding part arranged at a corner of the bottom surface of the package main body; and
a second protruding part arranged between the first electrode and the second electrode.

3. The semiconductor package according to claim 2, comprising a plurality of the second electrodes arrayed in the first direction, wherein
width of the second protruding part in the first direction is the same as an interval between the plurality of the second electrodes in the first direction.

4. The semiconductor package according to claim 2, wherein width of the second protruding part in the first direction is larger than width of the first protruding part in the first direction.

5. The semiconductor package according to claim 2, wherein width of the second protruding part in the second direction is larger than width of the second protruding part in the first direction.

6. The semiconductor package according to claim 2, wherein distance L1 between the first electrode and the second protruding part in the second direction is smaller than distance L2 between the second electrode and the second protruding part in the second direction.

7. The semiconductor package according to claim 2, wherein distance L1 between the first electrode and the second protruding part in the second direction is larger than distance L2 between the second electrode and the second protruding part in the second direction.

8. The semiconductor package according to claim 1, wherein an edge of the protruding part is rounded.

9. The semiconductor package according to claim 1, wherein a planar shape of the protruding part is rounded.

10. A semiconductor device comprising:
the semiconductor package according to claim 1;
the mount board to which the semiconductor package is attached; and
solder provided between the mount board and the semiconductor package.

11. The semiconductor package according to claim 1, wherein the protruding part is formed of a resin.

12. The semiconductor package according to claim 1, wherein the protruding part is formed of a material which is the same as a resin of the package main body.

13. The semiconductor package according to claim 1, further comprising
a glue that is provided in the gap between the package main body and a mount board and fastens together the package main body and the mount board.

14. The semiconductor package according to claim 1, wherein the protruding part is provided between the package main body and a mount board.

15. The semiconductor package according to claim 1, wherein the bottom surface of the package main body and bottom surfaces of the plurality of electrodes occupy the same plane.

16. The semiconductor package according to claim 1, wherein the package main body packages the semiconductor chip.

\* \* \* \* \*